US012721107B2

(12) United States Patent
Tanoue et al.

(10) Patent No.: US 12,721,107 B2
(45) Date of Patent: Aug. 25, 2026

(54) SUBSTRATE PROCESSING APPARATUS AND SUBSTRATE PROCESSING METHOD

(71) Applicant: Tokyo Electron Limited, Tokyo (JP)

(72) Inventors: Hayato Tanoue, Kikuchi-gun (JP); Kento Araki, Kikuchi-gun (JP); Yohei Yamashita, Kikuchi-gun (JP); Gousuke Shiraishi, Kikuchi-gun (JP)

(73) Assignee: Tokyo Electron Limited, Tokyo (JP)

( * ) Notice: Subject to any disclaimer, the term of this patent is extended or adjusted under 35 U.S.C. 154(b) by 457 days.

(21) Appl. No.: 18/261,520

(22) PCT Filed: Jan. 5, 2022

(86) PCT No.: PCT/JP2022/000099
§ 371 (c)(1),
(2) Date: Jul. 14, 2023

(87) PCT Pub. No.: WO2022/153894
PCT Pub. Date: Jul. 21, 2022

(65) Prior Publication Data

US 2024/0082957 A1 Mar. 14, 2024

(30) Foreign Application Priority Data

Jan. 15, 2021 (JP) ................................. 2021-005319

(51) Int. Cl.
*H10P 74/20* (2026.01)
*B23K 26/00* (2014.01)
(Continued)

(52) U.S. Cl.
CPC .......... *H10P 74/203* (2026.01); *B23K 26/035* (2015.10); *B23K 26/048* (2013.01);
(Continued)

(58) Field of Classification Search
CPC ........ H10P 74/203; H10P 54/20; H10P 54/30; H10P 56/00; B23K 26/0006; B23K 26/035; B23K 26/048; B23K 26/50
See application file for complete search history.

(56) References Cited

U.S. PATENT DOCUMENTS 10,220,472 B2 * 3/2019 Vockrodt ........... B23K 26/0626
11,101,167 B2 * 8/2021 Matsuo .................. H10P 72/74
(Continued)

FOREIGN PATENT DOCUMENTS

CN 103732550 A * 4/2014 ............. C03B 33/09
WO 2019176589 A1 9/2019

OTHER PUBLICATIONS

International Search Report of PCT/JP2022/000099 dated Mar. 15, 2022.

*Primary Examiner* — David A Zarneke
(74) *Attorney, Agent, or Firm* — Shih IP Law Group, PLLC.

(57) ABSTRACT

A substrate processing apparatus configured to process a combined substrate in which a first substrate and a second substrate are stacked on top of each other includes a substrate holder configured to hold the combined substrate; a laser radiating unit configured to radiate laser light to a laser absorbing film in a pulse shape; a moving mechanism configured to move the substrate holder and the laser radiating unit relative to each other; and a controller configured to control the laser radiating unit and the moving mechanism. The controller performs, based on a thickness of the laser absorbing film, a control of selecting a position of a separation surface between the first substrate and the second substrate from one of a position between the first substrate and the laser absorbing film or a position between the a separation facilitating film and the second substrate.

8 Claims, 10 Drawing Sheets

(51) Int. Cl.

| | |
|---|---|
| ***B23K 26/035*** | (2014.01) |
| ***B23K 26/046*** | (2014.01) |
| ***B23K 26/08*** | (2014.01) |
| ***B23K 26/50*** | (2014.01) |
| ***B23K 103/00*** | (2006.01) |
| ***H10P 56/00*** | (2026.01) |

(52) U.S. Cl.

CPC ........ *B23K 26/0823* (2013.01); *B23K 26/083* (2013.01); *H10P 56/00* (2026.01); *B23K 26/0006* (2013.01); *B23K 26/50* (2015.10); *B23K 2103/56* (2018.08)

(56) References Cited

U.S. PATENT DOCUMENTS

| | | | | |
|---|---|---|---|---|
| 11,752,576 | B2 * | 9/2023 | Tanoue | B23K 26/36 219/121.6 |
| 11,823,924 | B2 * | 11/2023 | Suzuki | H10P 72/0428 |
| 12,040,190 | B2 * | 7/2024 | Watanabe | H10P 34/42 |
| 12,561,823 | B2 * | 2/2026 | Fukuda | G06T 7/62 |
| 2014/0038392 | A1 * | 2/2014 | Yonehara | H10P 34/42 438/463 |
| 2021/0039203 | A1 | 2/2021 | Tanoue | |

* cited by examiner

SUBSTRATE PROCESSING APPARATUS AND SUBSTRATE PROCESSING METHOD

CROSS-REFERENCE TO RELATED APPLICATIONS

This Application is a U.S. national phase application under 35 U.S.C. § 371 of PCT Application No. PCT/JP2022/000099 filed on Jan. 5, 2022, which claims the benefit of Japanese Patent Application No. 2021-005319 filed on Jan. 15, 2021 the entire disclosures of which are incorporated herein by reference.

TECHNICAL FIELD

The various aspects and embodiments described herein pertain generally to a substrate processing apparatus and a substrate processing method.

BACKGROUND

Patent Document 1 describes a substrate processing system including a modification layer forming apparatus configured to form a modification layer within a first substrate along a boundary between a peripheral portion of the first substrate as a target of removing and a central portion thereof in a combined substrate in which the first substrate and a second substrate are bonded to each other, and a periphery removing apparatus configured to remove the peripheral portion of the first substrate starting from the modification layer. Further, Patent Document 1 also describes forming a modification layer within a device layer formed on a non-processing surface of the first substrate to reduce a bonding strength between the first substrate and the second substrate at the peripheral portion of the first substrate.

PRIOR ART DOCUMENT

Patent Document 1: International Publication No. 2019/176589

DISCLOSURE OF THE INVENTION

Means for Solving the Problems

In an exemplary embodiment, there is provided a substrate processing apparatus configured to process a combined substrate in which a first substrate, an interface layer including a laser absorbing film and a separation facilitating film at least, and a second substrate are stacked on top of each other. The substrate processing apparatus includes a substrate holder configured to hold the combined substrate; an interface laser radiating unit configured to radiate laser light to the laser absorbing film in a pulse shape; a moving mechanism configured to move the substrate holder and the interface laser radiating unit relative to each other; and a controller configured to control the interface laser radiating unit and the moving mechanism. The controller performs, based on a thickness of the laser absorbing film, a control of selecting a position of a separation surface between the first substrate and the second substrate from one of a position between the first substrate and the laser absorbing film or a position between the separation facilitating film and the second substrate.

BRIEF DESCRIPTION OF THE DRAWINGS

FIG. 4A to FIG. 4D are explanatory diagrams illustrating main processes of a wafer processing in the wafer processing system.

DETAILED DESCRIPTION

Figure 1A:
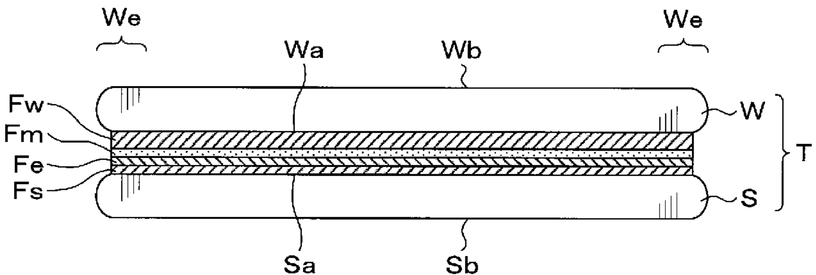
FIG. 1A is a side view illustrating an example structure of a combined wafer according to an exemplary embodiment.

In a manufacturing process for a semiconductor device, in a combined substrate in which a first substrate (a silicon substrate such as semiconductor substrate) having devices such as a plurality of electronic circuits formed on a front surface thereof and a second substrate are bonded to each other, removal of a peripheral portion of the first substrate, so-called edge trimming may be performed.

The edge trimming of the first substrate is performed by using a substrate processing system disclosed in Patent Document 1, for example. That is, a modification layer is formed by radiating laser light to an inside of the first substrate, and a peripheral portion is removed from the first substrate by using the modification layer as a starting point. Further, according to the substrate processing system described in Patent Document 1, a modification surface is formed by radiating laser light to an interface at which the first substrate and the second substrate are bonded, so that a bonding strength between the first substrate and the second substrate at the peripheral portion is reduced.

In this edge trimming, the laser light may be radiated to a laser absorbing layer (for example, an oxide film) formed between the first substrate and the second substrate to cause separation at the interface between the first substrate and the second substrate. However, when performing the edge trimming of the first substrate by radiating the laser light to the laser absorbing layer in this way, if the thickness of the laser absorbing layer is small, the amount of energy absorbed and stored in the laser absorbing layer by the radiation of the laser light is reduced, raising a risk that the edge trimming of the first substrate may not be performed properly.

In view of the foregoing, the present disclosure provides a technique capable of separating the first substrate from the second substrate appropriately in the combined substrate in which the first substrate and the second substrate are bonded to each other. Hereinafter, a substrate processing system as a substrate processing apparatus and a substrate processing method according to an exemplary embodiment will be described with reference to the accompanying drawings. In the present specification and drawings, parts having substantially the same functions and configurations will be assigned same reference numerals, and redundant description thereof will be omitted.

In a wafer processing system 1 to be described later according to the present exemplary embodiment, a processing is performed on a combined wafer T as a combined substrate in which a first wafer W as a first substrate and a second wafer S as a second substrate are bonded to each other, as shown in FIG. 1A. Hereinafter, in the first wafer W, a surface to be bonded to the second wafer S is referred to as front surface Wa, and a surface opposite to the front surface Wa is referred to as rear surface Wb. Likewise, in the second wafer S, a surface to be bonded to the first wafer W is referred to as front surface Sa, and a surface opposite to the front surface Sa is referred to as rear surface Sb.

The first wafer W is, for example, a semiconductor wafer such as a silicon substrate, and has a device layer (not shown) including a plurality of devices formed on the front surface Wa thereof. A laser absorbing film Fw as a laser absorbing layer, a metal film Fm as a separation facilitating film, and a surface film Fe are stacked on the front surface Wa of the first wafer W, and the surface film Fe is bonded to a surface film Fs of the second wafer S. A film such as, but not limited to, an oxide film ($SiO_2$ film or TEOS film) capable of absorbing laser light from a laser radiation system 110 to described later may be used as the laser absorbing film Fw. A film such as, but not limited to, a tungsten film whose adhesion to the surface film Fe is weaker than at least adhesion between the first wafer W and the laser absorbing film Fw may be used as the metal film Fm. Further, a peripheral portion We of the first wafer W is a portion to be removed in edge trimming to be described later, and is in the range of 0.5 mm to 3 mm from an outer end of the first wafer W in a radial direction. The surface film Fe may be, by way of non-limiting example, an oxide film (THOX film, $SiO_2$ film, or TEOS film), a SiC film, a SiCN film, an adhesive, or the like.

The second wafer S is a wafer configured to support the first wafer W, for example. The surface film Fs is formed on the front surface Sa of the second wafer S. As an example, the surface film Fs may be an oxide film (THOX film, $SiO_2$ film, or TEOS film), a SiC film, a SiCN film, or an adhesive. In addition, the second wafer S functions as a protective material (support wafer) configured to protect a device layer of the first wafer W. Furthermore, the second wafer S does not have to be a support wafer, and may be a device wafer having a non-illustrated device layer formed thereon, the same as the first wafer W.

In addition, in the combined wafer T according to the present exemplary embodiment, the above-described laser absorbing film Fw, metal film Fm, surface film Fe, and surface film Fs correspond to "interface layer" according to the present disclosure.

The following description will be provided for an example in which the combined wafer T having the laser absorbing film Fw, the metal film Fm, the surface film Fe, and the surface film Fs formed at the interface between the first wafer W and the second wafer S as shown in FIG. 1A is processed in the wafer processing system 1. However, the structure of the combined wafer T processed in the wafer processing system 1 is not limited thereto.

Figure 1B:
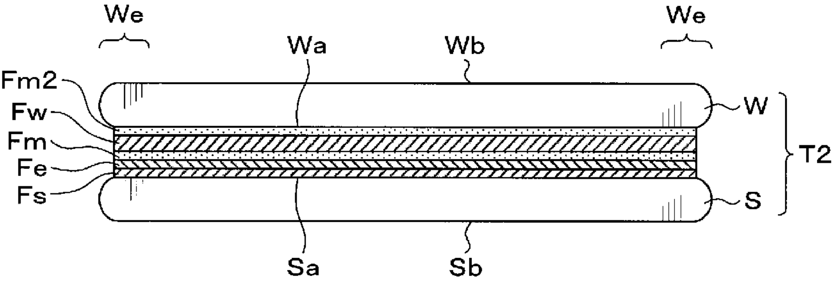
FIG. 1B is a side view illustrating another example structure of the combined wafer according to the exemplary embodiment.

For example, in the wafer processing system 1, a combined wafer T2 further including, as shown in FIG. 1B, a surface film Fm2 serving as a second separation facilitating film formed at an interface between the front surface Wa of the first wafer W and the laser absorbing film Fw may be processed. As the surface film Fm2, a film (for example, SiN film) whose adhesion to the front surface Wa of the first wafer W is smaller than at least adhesion of the laser absorbing film Fw and which is capable of transmitting the laser light from the laser radiation system 110 to be described later may be used. At this time, adhesion between the metal film Fm and the surface film Fe is smaller than the adhesion between the front surface Wa of the first wafer W and the surface film Fm2.

Figure 2:
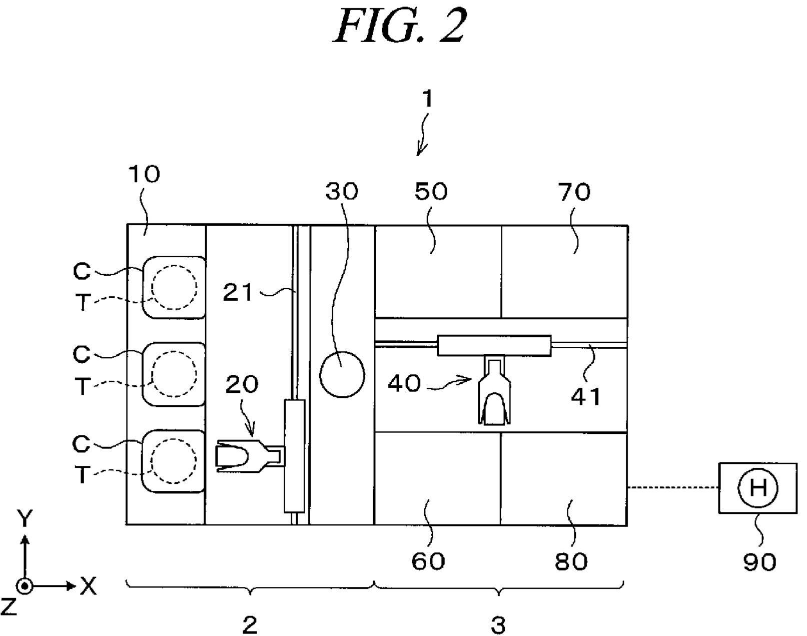
FIG. 2 is a plan view illustrating a schematic configuration of a wafer processing system according to the exemplary embodiment.

As illustrated in FIG. 2, the wafer processing system 1 has a configuration in which a carry-in/out station 2 and a processing station 3 are connected as one body. In the carry-in/out station 2, a cassette C capable of accommodating therein a plurality of combined wafers T is carried to/from the outside, for example. The processing station 3 is equipped with various types of processing apparatuses configured to perform required processings on the combined wafer T.

The carry-in/out station 2 is equipped with a cassette placing table 10 configured to place thereon the cassette C capable of accommodating therein the plurality of combined wafers T. Further, a wafer transfer device 20 is provided adjacent to the cassette placing table 10 on the positive X-axis side of the cassette placing table 10. The wafer transfer device 20 is configured to be moved on a transfer path 21 extending in the Y-axis direction to transfer the combined wafer T between the cassette C of the cassette placing table 10 and a transition apparatus 30 to be described later.

In the carry-in/out station 2, the transition apparatus 30 configured to deliver the combined wafer T to/from the processing station 3 is provided adjacent to the wafer transfer device 20 on the positive X-axis side of the wafer transfer device 20.

The processing station 3 is equipped with a wafer transfer device 40, a periphery removing apparatus 50 as a periphery removing unit, a cleaning apparatus 60, an interface modifying apparatus 70 as an interface laser radiating unit, and an internal modifying apparatus 80 as an internal laser radiating unit.

The wafer transfer device 40 is provided on the positive X-axis side of the transition apparatus 30. The wafer transfer device 40 is configured to be movable on a transfer path 41 extending in the X-axis direction, and is configured to transfer the combined wafer T to/from the transition apparatus 30 of the carry-in/out station 2, the periphery removing apparatus 50, the cleaning apparatus 60, the interface modifying apparatus 70, and the internal modifying apparatus 80.

The periphery removing apparatus 50 is configured to perform removal of the peripheral portion We of the first wafer W, that is, edge trimming. The cleaning apparatus 60 is configured to perform a cleaning processing on an exposed surface of the second wafer S after the edge trimming to remove particles on the exposed surface. The interface modifying apparatus 70 is configured to radiate laser light (laser light for interface, such as $CO_2$ laser) to the interface between the first wafer W and the second wafer S to form a non-bonding region Ae to be described later. A detailed configuration of the interface modifying apparatus 70 will be described later. The internal modifying apparatus 80 is configured to radiate laser light (laser light for inside, such as YAG laser) to the inside of the first wafer W to form a peripheral modification layer M1 serving as a starting point for separation of the peripheral portion We and a split modification layer M2 serving as a starting point for division of the peripheral portion We into smaller pieces.

The above-described wafer processing system 1 is equipped with a control device 90 as a controller. The control device 90 is, for example, a computer, and has a program storage (not shown). The program storage stores therein a program for controlling the processing of the combined wafer T in the wafer processing system 1. The program storage also stores therein a program for implementing a wafer processing to be described later in the wafer processing system 1 by controlling operations of a driving system such as the transfer devices and the various types of processing apparatuses described above. In addition, the programs may have been recorded in a computer-readable recording medium H, and may be installed from the recording medium H to the control device 90.

Now, the detailed configuration of the interface modifying apparatus 70 will be discussed.

Figure 3:
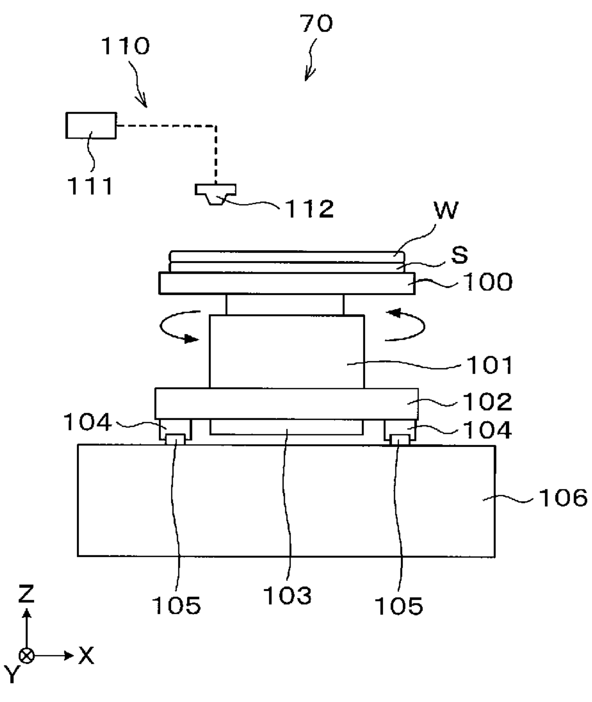
FIG. 3 is a side view illustrating a schematic configuration of an interface modifying apparatus.

As depicted in FIG. 3, the interface modifying apparatus 70 has a chuck 100 as a substrate holder configured to hold the combined wafer T on a top surface thereof. The chuck 100 attracts and holds the rear surface Sb of the second wafer S.

The chuck 100 is supported by a slider table 102 with an air bearing 101 therebetween. A rotating mechanism 103 is provided on a bottom surface of the slider table 102. The rotating mechanism 103 incorporates therein, for example, a motor as a driving source. The chuck 100 is configured to be rotatable around a θ-axis (vertical axis) via the air bearing 101 by the rotating mechanism 103. The slider table 102 is configured to be movable along a rail 105 extending in the Y-axis direction by a horizontally moving mechanism 104 provided on a bottom surface thereof. The rail 105 is provided on a base 106. In addition, although a driving source of the horizontally moving mechanism 104 is not specifically limited, a linear motor is used, for example. In the present exemplary embodiment, the rotating mechanism 103 and the horizontally moving mechanism 104 mentioned above correspond to "moving mechanism" according to the present disclosure.

Above the chuck 100, there is provided the laser radiation system 110. The laser radiation system 110 has a laser head 111 and a lens 112. The lens 112 may be configured to be movable up and down by an elevating mechanism (not shown).

The laser head 111 has a non-illustrated laser oscillator configured to oscillate laser light in a pulse shape. That is, the laser light radiated from the laser radiation system 110 to the combined wafer T held by the chuck 100 is a so-called pulse laser, and its power repeats 0 (zero) and a maximum value. Further, in the present exemplary embodiment, the laser light is $CO_2$ laser light, and the wavelength of this $CO_2$ laser light is in the range of, e.g., 8.9 μm to 11 μm. In addition, the laser head 111 may have other devices of the laser oscillator, such as an amplifier.

The lens 112 is a cylindrical member, and radiates the laser light to the combined wafer T held by the chuck 100. The laser light emitted from the laser radiation system 110 is radiated to and absorbed by the laser absorbing film Fw after penetrating the first wafer W.

Now, a wafer processing performed by using the wafer processing system 1 configured as described above will be explained. As an example, the present exemplary embodiment will be described for the case where the peripheral portion We of the first wafer W is separated from the second wafer S in the wafer processing system 1 (that is, so-called edge-trimming is performed), as stated above. Further, in the present exemplary embodiment, the combined wafer T is formed in advance by bonding the first wafer W and the second wafer S in a bonding apparatus (not shown) outside the wafer processing system 1.

First, the cassette C accommodating the plurality of combined wafers T is placed on the cassette placing table 10 of the carry-in/out station 2.

Figures 4A, 4B, 4C, 4D:
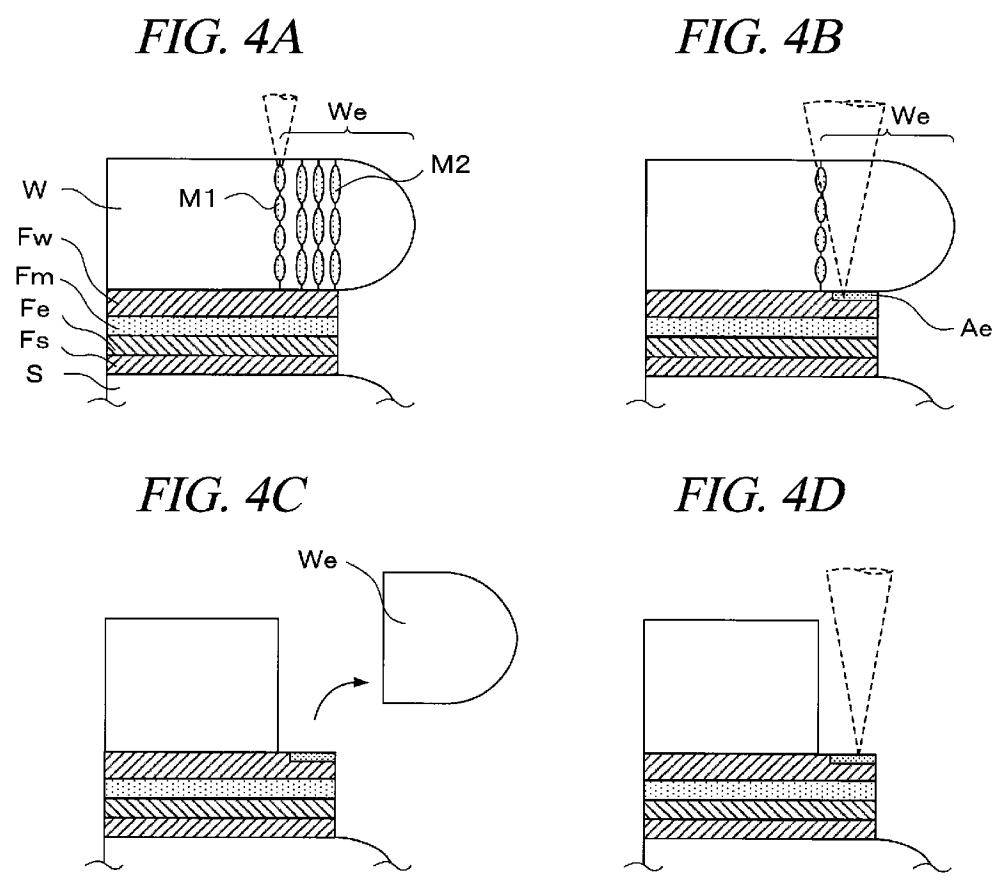

Then, the combined wafer T in the cassette C is taken out by the wafer transfer device 20, and transferred to the internal modifying apparatus 80 via the transition apparatus 30 by the wafer transfer device 40. In the internal modifying apparatus 80, by radiating the laser light to the inside of the first wafer W, the peripheral modification layer M1 and the split modification layer M2 are formed, as shown in FIG. 4A. The peripheral modification layer M1 serves as a starting point when removing the peripheral portion We in the edge trimming to be described later. The split modification layer M2 serves as a starting point when dividing the peripheral portion We being removed into smaller pieces. In the drawings to be referred to in the following description, illustration of the split modification layer M2 may be omitted in order to avoid complication of the illustration.

The combined wafer T in which the peripheral modification layer M1 and the split modification layer M2 are formed within the first wafer W is then transferred to the interface modifying apparatus 70 by the wafer transfer device 40. In the interface modifying apparatus 70, the laser light is radiated in the pulse shape to the interface (more specifically, the above-described laser absorbing film Fw formed at the interface) between the first wafer W and the second wafer S at the peripheral portion We, while rotating the combined wafer T (the first wafer W) and moving it in the Y-axis direction. As a result, as depicted in FIG. 4B, separation occurs at the interface between the first wafer W and the second wafer S.

Figure 5:
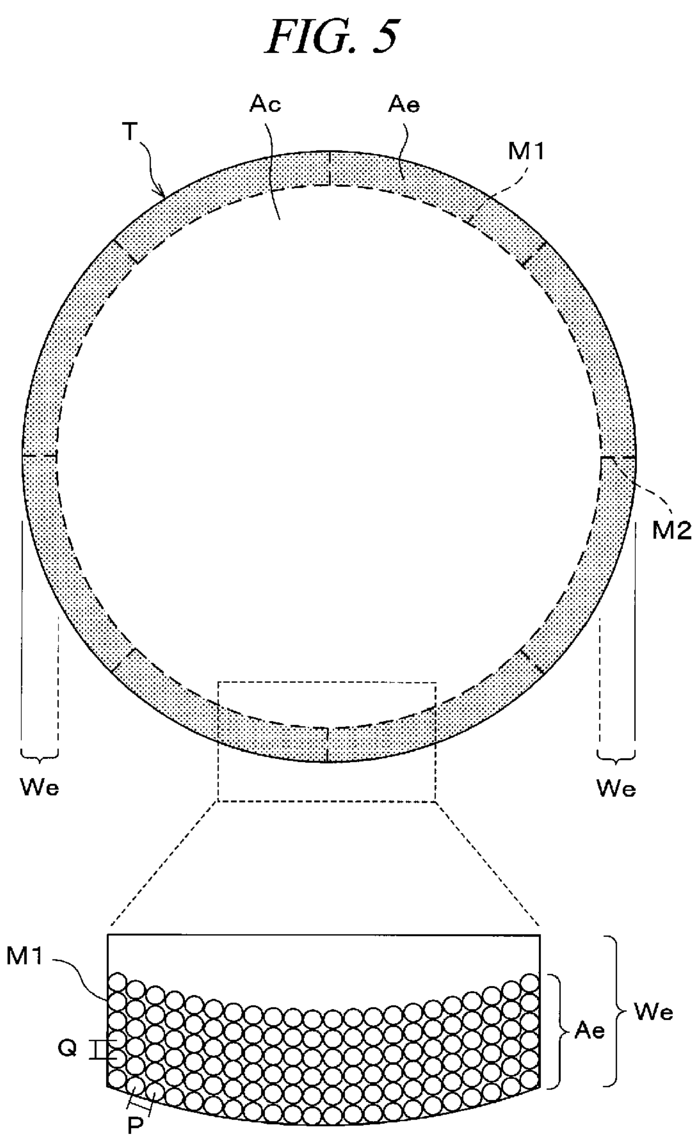
FIG. 5 is an explanatory diagram illustrating a state of the combined wafer radiated with laser light.

In the interface modifying apparatus 70, since the separation occurs at the interface between the first wafer W and the second wafer S in this way, there is formed the non-bonding region Ae in which bonding strength between the first wafer W and the second wafer S is reduced. That is, at the interface between the first wafer W and the second wafer S, the non-bonding region Ae is formed in an annular shape, and, also, a bonding region Ac in which the first wafer W and the second wafer S are bonded is formed at an inner side than the non-bonding region Ae in the radial direction, as shown in FIG. 5. In the edge trimming to be described later, the peripheral portion We of the first wafer W as a target of removing is removed. Since the non-bonding region Ae exists as described above, the removing of the peripheral We can be carried out appropriately.

A detailed method of forming the non-bonding region Ae in the interface modifying apparatus 70 will be discussed later.

The combined wafer T in which the non-bonding region Ae is formed is then transferred to the periphery removing apparatus 50 by the wafer transfer device 40. In the periphery removing apparatus 50, the removal of the peripheral portion We of the first wafer W, that is, the edge trimming is performed, as illustrated in FIG. 4C. At this time, the peripheral portion We is separated from a central portion of the first wafer W starting from the peripheral modification layer M1, and is completely separated from the second wafer S starting from the non-bonding region Ae. Further, at this time, the peripheral portion We being removed is divided into small pieces starting from the split modification layer M2.

In removing the peripheral portion We, a wedge-shaped blade, for example, may be inserted into the interface between the first wafer W and the second wafer S forming the combined wafer T. Further, by discharging, for example, an air blow or a water jet, the peripheral portion We may be removed by being hit. In this way, in the edge trimming, by applying an impact to the peripheral portion We of the first wafer W, the peripheral portion We is separated starting from the peripheral modification layer M1. Since the bonding strength between the first wafer W and the second wafer S is reduced in the non-bonding region Ae as stated above, the peripheral portion We is appropriately removed from the second wafer S.

The combined wafer T from which the peripheral portion We of the first wafer W is removed is then transferred to the cleaning apparatus 60 by the wafer transfer device 40. In the cleaning apparatus 60, a peripheral portion of the second wafer S (hereinafter, sometimes referred to as "exposed surface" after the edge trimming) after the peripheral portion We is removed is cleaned, as shown in FIG. 4D.

In the cleaning apparatus 60, by radiating laser light for cleaning (for example, $CO_2$ laser) to the exposed surface of the second wafer S, the exposed surface may be modified and removed, so that particles or the like remaining on the exposed surface are removed (cleaned). For example, by supplying a cleaning liquid to the exposed surface of the second wafer S while rotating the combined wafer T, the exposed surface may be cleaned by spinning.

In addition, in the cleaning apparatus 60, the rear surface Sb of the second wafer S may be further cleaned together with the exposed surface of the second wafer S.

Thereafter, the combined wafer T after being subjected to all the required processings is transferred to the cassette C of the cassette placing table 10 by the wafer transfer device 20 via the transition apparatus 30. In this way, the series of processes of the wafer processing in the wafer processing system 1 are completed.

In the above description, after the peripheral modification layer M1 and the split modification layer M2 are formed by the internal modifying apparatus 80, the non-bonding region Ae is formed by the interface modifying apparatus 70, as shown in FIG. 4A and FIG. 4B. However, the sequence of the wafer processing in the wafer processing system 1 is not limited thereto. That is, the peripheral modification layer M1 and the split modification layer M2 may be formed by the internal modifying apparatus 80 after the non-bonding region Ae is formed by the interface modifying apparatus 70.

Here, in the interface modifying apparatus 70, the laser light is radiated from the laser radiation system 110 to the laser absorbing film Fw formed at the interface between the first wafer W and the second wafer S. The radiated laser light is absorbed by the laser absorbing film Fw. At this time, the laser absorbing film Fw accumulates energy by absorbing the laser light, so that the temperature of the laser absorbing film Fw increases and the laser absorbing film Fw is expanded. Due to this expansion of the laser absorbing film Fw, a shear stress is generated at the interface between the first wafer W and the laser absorbing film Fw (in the combined wafer T2 shown in FIG. 1B, the interface between the first wafer W and the surface film Fm2 having weak adhesion), which causes separation at the interface between the first wafer W and the laser absorbing film Fw (surface film Fm2). That is, the non-bonding region Ae in which the bonding strength between the first wafer W and the second wafer S is reduced due to the separation is formed at the position to which the laser light is radiated.

As stated above, in the interface modifying apparatus 70, the non-bonding region Ae is typically formed at the interface between the laser absorbing film Fw (surface film Fm2) and the first wafer W. However, when the thickness of the laser absorbing film Fw is small, the amount of the energy absorbed and stored in the laser absorbing film Fw is small. That is, since the amount of the expansion of the laser absorbing film Fw is reduced, the shear stress generated at the interface between the first wafer W and the laser absorbing film Fw (surface film Fm2) is reduced, which raises a concern that the interface between the first wafer W and the laser absorbing film Fw (surface film Fm2) may not be separated properly, resulting in a failure to form the non-bonding region Ae appropriately.

To solve the problem, in the present exemplary embodiment, the metal film Fm as the separation facilitating film is formed at the interface between the first wafer W and the second wafer S, as illustrated in FIG. 1A and FIG. 1B. A film whose adhesion to the surface film Fe is weaker than at least the adhesion between the first wafer W and the laser absorbing film Fw (surface film Fm2) is used as the metal film Fm. In the following description, the interface between the first wafer W and the laser absorbing film Fw (in the combined wafer T2 shown in FIG. 1B, the interface between the first wafer W and the surface film Fm2) will sometimes be referred to as "interface A," and the interface between the metal film Fm and the surface film Fe will sometimes be referred to as "interface B" (see FIG. 6A and FIG. 6B).

Accordingly, in the present exemplary embodiment, even when the thickness of the laser absorbing film Fw is small so the shear stress generated at the interface A by the radiation of the laser light is small, the non-bonding region Ae can be formed by causing the separation at the interface B where the adhesion is weak. Specifically, even when the shear stress generated due to the expansion of the laser absorbing film Fw does not reach a stress level required for the separation of the interface A, it can still reach a stress level required for the separation of the interface B, and, as a result, the non-bonding region Ae can be formed at the interface B instead of the interface A.

In other words, in the present exemplary embodiment, even when the thickness of the laser absorbing film Fw is small so it has been conventionally difficult to separate the first wafer W from the second wafer S appropriately, the separation (edge trimming) of the first wafer W can still be carried out appropriately.

Meanwhile, even if the metal film Fm is formed at the interface between the first wafer W and the second wafer S as shown in FIG. 1A and FIG. 1B, when the thickness of the laser absorbing film Fw is large, there is a risk that the non-bonding region Ae may not be properly formed at the interface B if the radiation of the laser light is performed under the same conditions as in the case where the thickness of the laser absorbing film Fw is small. Specifically, when the thickness of the laser absorbing film Fw is large, there is a risk that the energy by the radiation of the laser light may not reach the interface on the side of the metal film Fm, which is the surface opposite to the surface on which the laser light is incident, and, as a result, the shear stress required for the separation of the interface B may not be generated.

That is, when the radiation of the laser light is performed on a plurality of combined wafers T that are processed consecutively under the same processing conditions, for example, if the thickness of the laser absorbing film Fw is not uniform among the combined wafers T, the edge trimming may not be properly performed in the combined wafer T having the laser absorbing film Fw of a large thickness, raising a risk that the yield may decrease.

In this regard, the present inventors have conducted intensive researches and found out that the position of the separation surface between the first wafer W and the second wafer S (the position where the non-bonding region Ae is formed) can be selected by controlling a pulse pitch P, which is a radiation interval of the laser light to the laser absorbing film Fw in a circumferential direction, and an index pitch Q, which is a radiation interval of the laser light to the laser absorbing film Fw in the radial direction (see FIG. 5: hereinafter, the pulse pitch P and the index pitch Q may sometimes be simply referred to "radiation interval" together).

Figure 7:
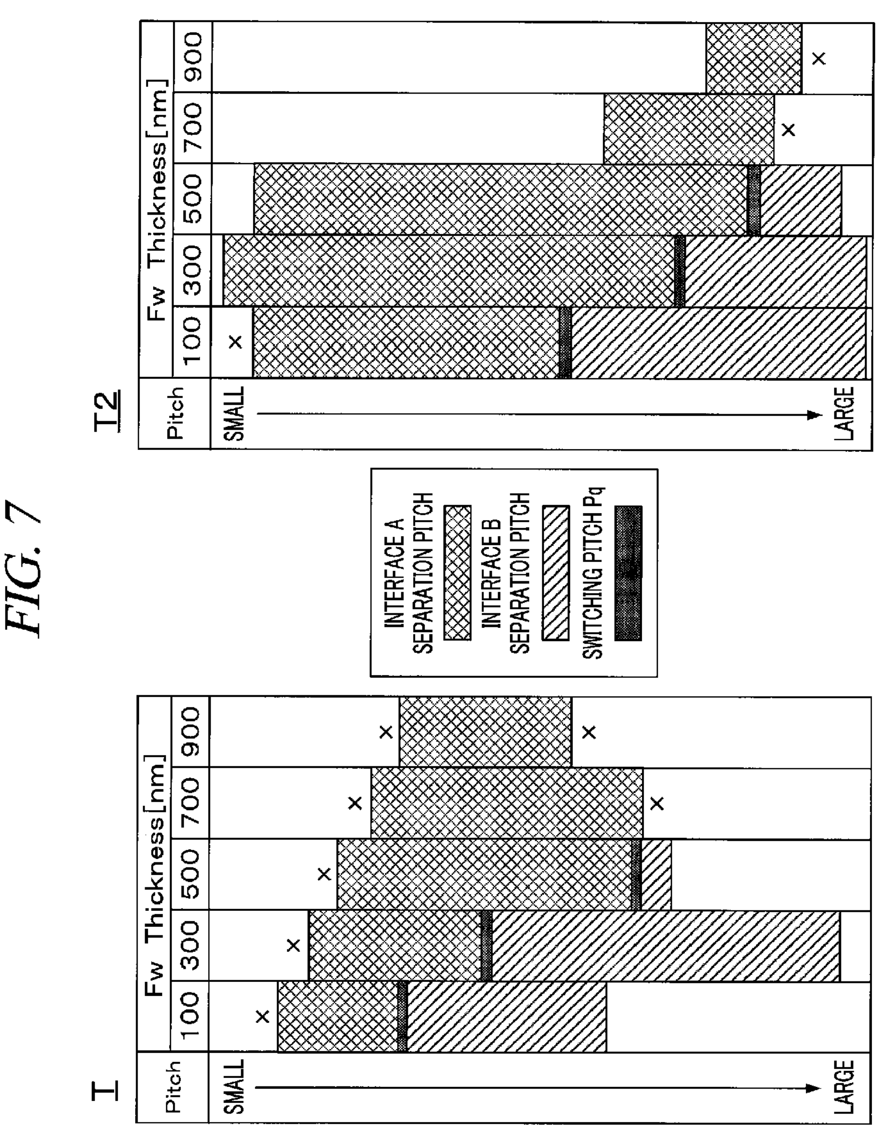
FIG. 7 is a table showing a correlation between a thickness of a laser absorbing film and a radiation interval of the laser light, and the position of the separation surface of the first wafer.

To elaborate, as illustrated in FIG. 7, it is found out that when the radiation interval of the laser light to the laser absorbing film Fw is narrow, the separation occurs at the interface (interface A) between the first wafer W and the laser absorbing film Fw (surface film Fm2), whereas when the radiation interval is widened, the separation occurs at the interface (interface B) between the metal film Fm and the surface film Fe. Further, in the following description, as illustrated in FIG. 7, the radiation interval at which the separation occurs at the interface A will sometimes be referred to "interface A separation pitch", and the radiation interval at which the separation occurs at the interface B will sometimes be referred to as "interface B separation pitch."

In addition, the present inventors have also found out that the radiation interval of the laser light at which the position of the separation surface of the first wafer W and the second wafer S is switched between the interface A and the interface B (hereinafter, referred to as "switching pitch Pq") varies depending on the thickness of the laser absorbing film Fw. Specifically, as shown in FIG. 7, it is found that the switching pitch Pq increases with a rise of the thickness of the laser absorbing film Fw. Further, the present inventors have also found that when the thickness of the laser absorbing film Fw increases (to be equal to or larger than 700 nm in the example of FIG. 7), the separation does not occur at the interface B, but only occurs at the interface A.

Now, based on the above-described knowledge, a method of forming the non-bonding region Ae at the interface between the first wafer W and the second wafer S, which is performed by the interface modifying apparatus 70, will be described.

Figure 8:
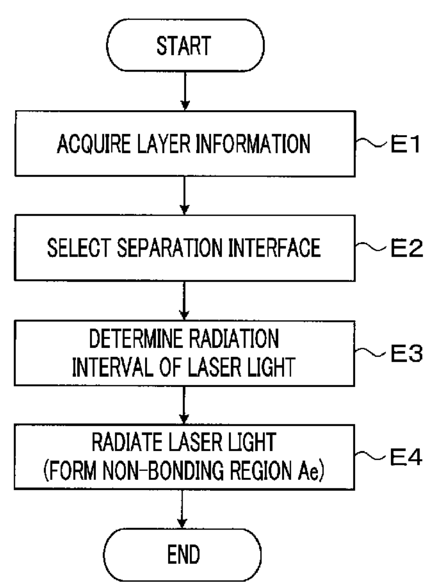
FIG. 8 is a flowchart illustrating main processes of the wafer processing according to the exemplary embodiment.

In the formation of the non-bonding region Ae in the interface modifying apparatus 70, the thickness of the laser absorbing film Fw is first acquired as layer information of the combined wafer T in which the non-bonding region Ae is to be formed (process E1 in FIG. 8). The acquired layer information of the combined wafer T is outputted to the control device 90.

The layer information of the combined wafer T may be acquired by the interface modifying apparatus 70, or may be obtained in advance at the outside of the interface modifying apparatus 70.

Further, the way to acquire the layer information of the combined wafer T is not particularly limited. For example, it may be measured by a sensor or the like, or may be obtained by taking an image of the combined wafer T with a camera or the like.

Moreover, the acquired layer information of the combined wafer T is not merely limited to the thickness information of the laser absorbing film Fw. In addition to the thickness information of the laser absorbing film Fw, the thickness of the non-illustrated device layer or the tendency of the surface shape (for example, whether it is a protrusion shape or a recess shape) of the first wafer W and the second wafer S may be obtained.

Figure 6:
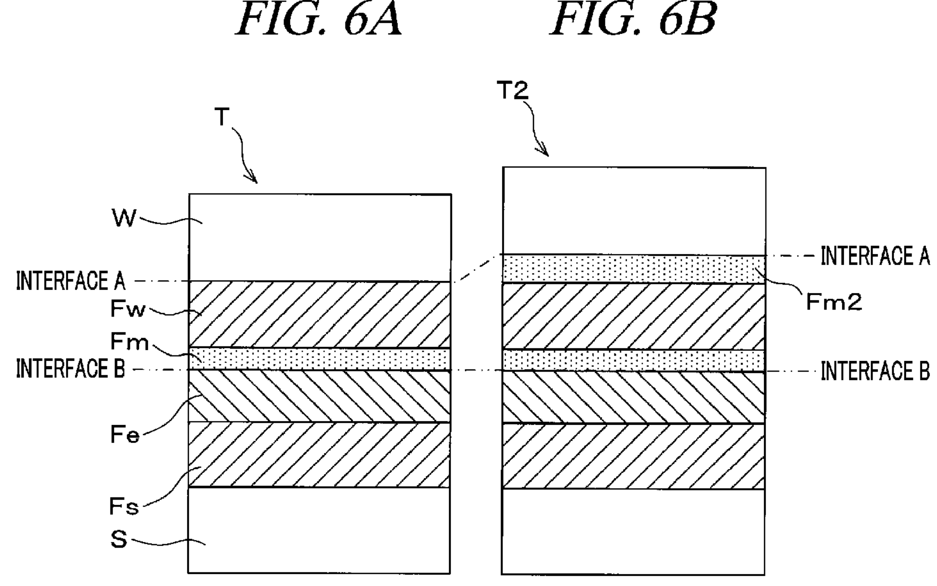
FIG. 6A and FIG. 6B are explanatory diagrams showing a position of a separation surface of a first wafer.

Once the layer information of the combined wafer T (thickness information of the laser absorbing film Fw) is obtained, the position of the separation surface between the first wafer W and the second wafer S is then selected from the interface A and the interface B shown in FIG. 6A and FIG. 6B (process E2 in FIG. 8). As a specific example, it may be determined based on the layer information of the combined wafer T obtained in the process E1, or may be determined according to the purpose of the wafer processing. When determining the position of the separation surface based on the layer information of the combined wafer T, it may be appropriately determined manually, or may be determined automatically by using a required thickness of the laser absorbing film Fw as a threshold value, based on the acquired layer information in any case.

Once the position of the separation surface between the first wafer W and the second wafer S is selected, the radiation interval (the pulse pitch P and the index pitch Q) of the laser light to be radiated to the laser absorbing film Fw from the laser radiation system 110 is then determined (process E3 in FIG. 8).

As depicted in FIG. 7, in the combined wafer T, when the radiation interval of the laser light is equal to or less than the switching pitch Pq (interface A separation pitch), the non-bonding region Ae is formed at the interface A, whereas when the radiation interval of the laser light is larger than the switching pitch Pq (interface B separation pitch), the non-bonding region Ae is formed at the interface B. In other words, the position of the separation surface where the first wafer W is separated from the second wafer S changes according to the radiation interval of the laser light. Furthermore, the switching pitch Pq at which the position of the separation surface is switched increases as the thickness of the laser absorbing film Fw formed on the front surface Wa of the first wafer W increases.

Thus, in the present exemplary embodiment, the radiation interval of the laser light to be radiated to the laser absorbing film Fw is determined based on the layer information of the combined wafer T (thickness of the laser absorbing film Fw) obtained in the process E1 and the position of the separation surface selected in the process E2. To be specific, when it is determined in the process E2 that the first wafer W is to be separated at the interface A, the radiation interval is determined from the interface A separation pitch less than or equal to the switching pitch Pq. Meanwhile, when it is determined that the first wafer W is to be separated at interface B, the radiation interval is selected from the interface B separation pitch larger than the switching pitch Pq.

Further, it is desirable that a correlation between the thickness of the laser absorbing film Fw and the radiation interval of the laser light, and the position of the separation surface of the first wafer W shown in FIG. 7 is acquired in advance prior to the start of the wafer processing in the wafer processing system 1 and outputted to the control device 90.

Here, as described above, if the radiation interval is equal to or less than the switching pitch Pq, the separation surface of the first wafer W becomes the interface A, whereas if the radiation interval is larger than the switching pitch Pq, the separation surface of the first wafer W becomes the interface B. In other words, the radiation interval of the laser light for the purpose of separating the first wafer W at the interface A or the interface B can be arbitrarily selected as long as it is within the range of the interface A separation pitch or the range of the interface B separation pitch.

Therefore, in the determination of the radiation interval of the laser light in the process E3, by selecting, for example, the largest radiation interval from the interface A separation pitch and the interface B separation pitch as the radiation interval of the laser light, a throughput in the interface modifying apparatus 70 can be improved. Further, by appropriately selecting the radiation interval of the laser light from the interface A separation pitch and the interface B separation pitch, for example, the throughput in the interface modifying apparatus 70 can be controlled as required, so that it becomes easy to match a tact with other processing apparatuses outside the interface modifying apparatus 70, for example.

Furthermore, as described above, the interface (interface B) between the metal film Fm and the surface film Fe tends to become the separation surface of the first wafer W when the radiation interval of the laser light is widened. From this point of view, when a determination that the first wafer W can be separated at the interface B is made based on the thickness of the laser absorbing film Fw obtained in the process E1, the throughput in the interface modifying apparatus 70 can be improved by setting the interface B as the separation surface of the first wafer W.

After the radiation interval of the laser light is determined, the laser light is radiated to the laser absorbing film Fw of the combined wafer T held by the chuck 100 at the determined radiation interval (process E4 in FIG. 8). Specifically, the frequency of the laser light and the rotational speed of the chuck 100 (combined wafer T) are controlled such that the laser light is radiated at the determined pulse pitch P, and, also, the moving speed of the chuck 100 (combined wafer T) in the Y-axis direction is controlled such that the laser light is radiated at the determined index pitch Q.

Thereafter, the laser light is radiated to the entire surface of the laser absorbing film Fw at the peripheral portion We as the target of removing, so that the non-bonding region Ae is formed. Then, the series of processes of the wafer processing in the interface modifying apparatus 70 are ended.

As described above, according to the present exemplary embodiment, in the removal (edge trimming) of the peripheral portion We of the first wafer W, by radiating the laser light to the laser absorbing film Fw formed at the interface between the first wafer W and the second wafer S, the non-bonding region Ae is formed, so that the bonding strength at the interface between the first wafer W and the second wafer S is reduced. At this time, since the metal film Fm whose adhesion to the surface film Fe is weaker than the adhesion between the first wafer W and the laser absorbing film Fw is formed at the interface between the first wafer W and the second wafer S, even when it is difficult to separate the peripheral portion We at the interface (interface A) between the first wafer W and the laser absorbing film Fw, the peripheral portion We can be appropriately separated at the interface (interface B) between the metal film Fm and the surface film Fe.

Further, according to the present exemplary embodiment, by controlling the radiation interval (pulse pitch P and index pitch Q) of the laser light to be radiated to the laser absorbing film Fw based on the thickness of the laser absorbing film Fw, it may be selectively determined whether the first wafer W is to be separated at the interface A or the interface B as described above. Accordingly, even when the thickness of the laser absorbing film Fw is non-uniform among the plurality of combined wafers T processed by the interface modifying apparatus 70, the peripheral portion We of the first wafer W can be appropriately separated in the respective combined wafer T. Specifically, according to the present exemplary embodiment, even when the thickness of the laser absorbing film Fw is small so it has been conventionally difficult to separate the peripheral portion We at the interface A, the peripheral portion We can be separated at the interface B appropriately.

Furthermore, according to the present exemplary embodiment, the edge trimming of the first wafer W can be performed with substantially constant pulse energy regardless of the thickness of the laser absorbing film Fw formed at the interface of the combined wafer T.

Figure 9:
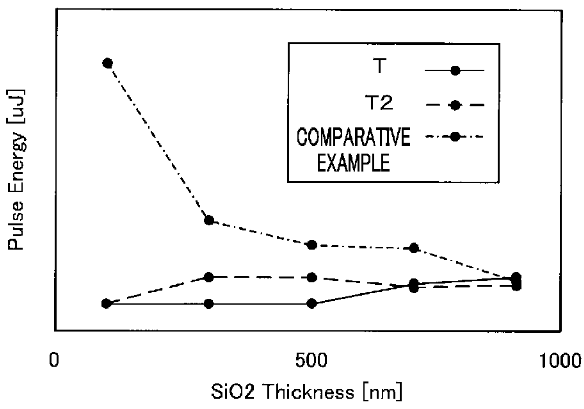
FIG. 9 is a graph showing a tendency of a relationship between the thickness of the laser absorbing film and pulse energy of the laser light.

Specifically, as shown in a comparative example of FIG. 9, in a conventional combined wafer T in which the metal film Fm is not formed at the interface, when the thickness of the laser absorbing film Fw is small, the volume that absorbs the pulse energy is small, so absorption efficiency of the energy is low, which results in an increase of the pulse energy required for the separation. In other words, energy control associated with the separation of the first wafer W (formation of the non-bonding region Ae) becomes complicated, and, also, there is a room for improvement in terms of energy efficiency as well.

In this respect, in the combined wafers T and T2 according to the present exemplary embodiment in which the metal film Fm is formed at the interface, the separation of the first wafer W (formation of the non-bonding region Ae) can be carried out with the pulse energy that is substantially constant regardless of the thickness of the laser absorbing film Fw, as shown in FIG. 9. That is, according to the present exemplary embodiment, the separation of the first wafer W (formation of the non-bonding region Ae) can be accomplished with high energy efficiency through a simple control.

Further, according to the present exemplary embodiment, the radiation interval of the laser light for the purpose of separating the first wafer W at the interface A or the interface B can be selected as required from the interface A separation pitch or the interface B separation pitch, as stated above. Accordingly, the throughput in the interface modifying apparatus 70 can be appropriately controlled.

As a specific example, the throughput in the interface modifying apparatus 70 can be improved to the maximum by radiating the laser light at the largest radiation interval in the range of the interface A separation pitch or the interface B separation pitch.

As another example, by radiating the laser light at an arbitrary radiation interval in the range of the interface A separation pitch or the interface B separation pitch, a laser processing time in the interface modifying apparatus 70 can be adjusted to a laser processing time required by the wafer processing system 1, whereby it is possible to easily match the tact with other processing apparatuses. In other words, the wafer processing in the entire wafer processing system 1 can be optimized, that is, the throughput in the entire wafer processing system 1 can be improved.

Moreover, in the above-described exemplary embodiment, the radiation interval of the laser light with respect to the laser absorbing film Fw is determined based on the thickness of the laser absorbing film Fw formed at the interface of the combined wafer T, as stated above. However, when it is necessary to perform the control with a certain desired radiation interval in the interface modifying apparatus 70, the combined wafer T may be formed by determining the thickness of the laser absorbing film Fw based on this radiation interval.

Likewise, when there is a certain request for the position of the separation surface between the first wafer W and the second wafer S according to the purpose of the wafer processing or the like, the combined wafer T may be formed by determining the thickness of the laser absorbing film Fw based on the requested position of the separation surface.

In the above-described exemplary embodiment, since the removal of the peripheral portion We of the first wafer W, that is, the edge trimming is performed in the wafer processing system 1, the description has been provided for the example where the laser light is radiated to the laser absorbing film Fw located at the position corresponding to the peripheral portion We. However, the wafer processing performed in the wafer processing system 1 is not limited to the edge trimming.

Figures 10A, 10B:
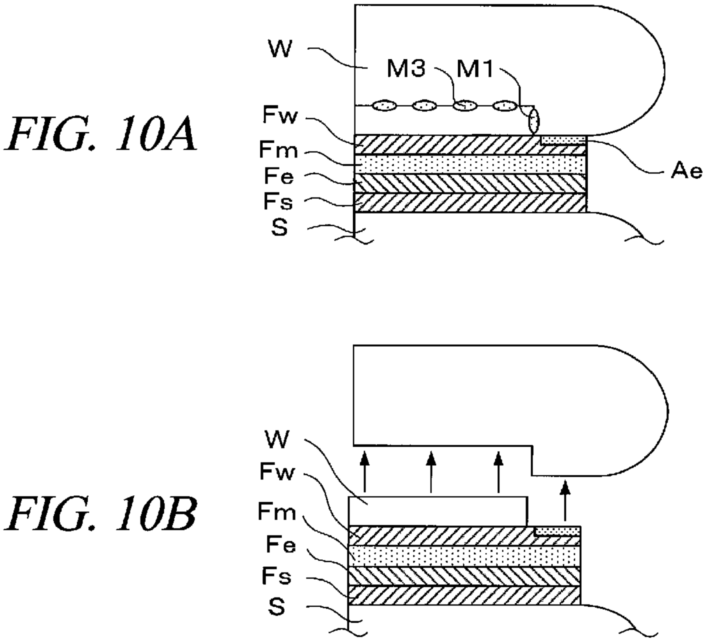
FIG. 10A and FIG. 10B are explanatory diagrams illustrating main processes of another wafer processing in the wafer processing system.

By way of example, as shown in FIG. 10A and FIG. 108, the technique of the present disclosure is also applicable to a case in which an internal modification layer M3 serving as a starting point when thinning the first wafer W is formed inside the first wafer W and the peripheral portion We is removed as one body with the rear surface Wb side of the first wafer W.

Specifically, as shown in FIG. 10A, after sequentially forming the peripheral modification layer M1 and the internal modification layer M3 in the internal modifying apparatus 80, the non-bonding region Ae is also formed at the position corresponding to the peripheral portion We in the interface modifying apparatus 70. As a result, as illustrated in FIG. 1013, the first wafer W is thinned starting from the internal modification layer M3, and the peripheral portion We is removed as one body therewith by being separated starting from the peripheral modification layer M1 and the non-bonding region Ae.

Even in such a case, by forming the metal film Fm at the interface between the first wafer W and the second wafer S and controlling the radiation interval of the laser light to the laser absorbing film Fw, the position of the separation surface of the peripheral portion We can be appropriately selected from the interface A and the interface B. In other words, the first wafer W can be appropriately separated from the second wafer S regardless of the thickness of the laser absorbing film Fw.

Figures 11A, 11B:
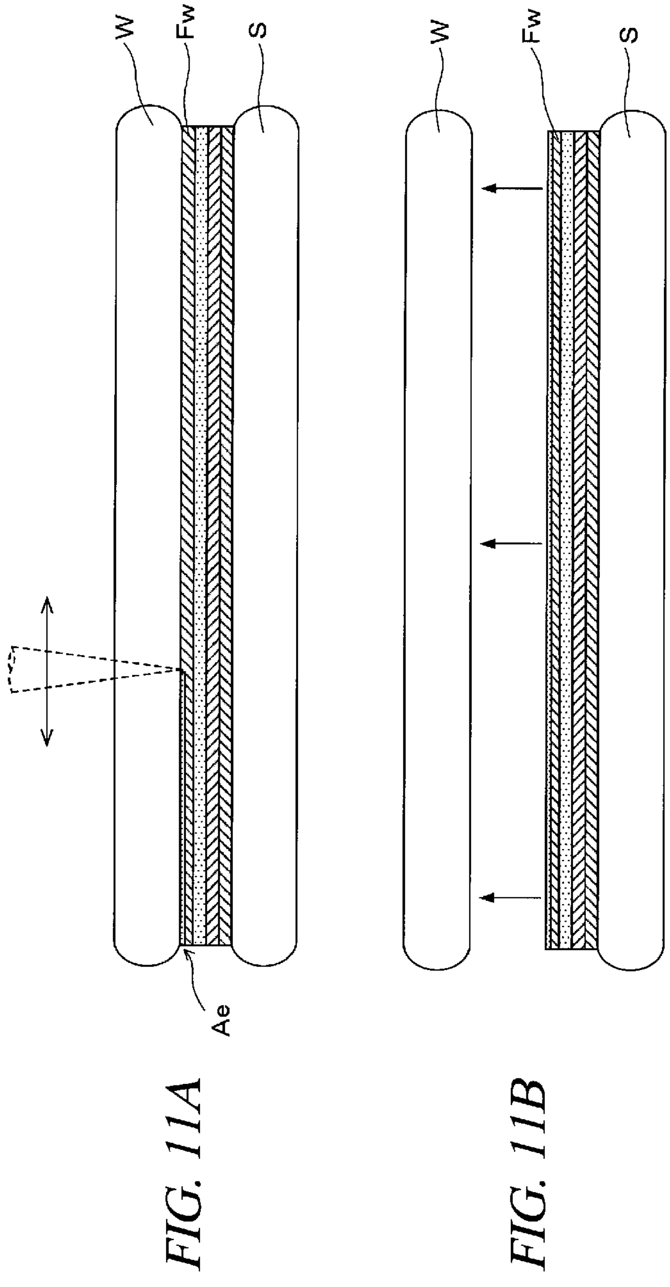
FIG. 11A and FIG. 11B are explanatory diagrams illustrating main processes of still another wafer processing in the wafer processing system.

Further, as shown in FIG. 11A and FIG. 11B, for example, the technique of the present disclosure may also be applicable to a case of separating the entire surface of the first wafer W from the second wafer S and transferring the non-illustrated device layer formed on the front surface Wa of the first wafer W to the second wafer S, that is, a case of performing so-called laser lift-off.

To elaborate, as depicted in FIG. 11A, in the interface modifying apparatus 70, by radiating the laser light to the laser absorbing film Fw on the entire surface of the combined wafer T, the non-bonding region Ae is formed. Accordingly, the bonding strength between the first wafer W and the second wafer S is reduced in the entire surface of the combined wafer T, so that the first wafer W can be appropriately separated from the second wafer S, as shown in FIG. 11B.

Even in such a case, by forming the metal film Fm at the interface between the first wafer W and the second wafer S and controlling the radiation interval of the laser light to the laser absorbing film Fw, the position of the separation surface of the first wafer W can be appropriately selected from the interface A and the interface B. In other words, the first wafer W can be appropriately separated from the second wafer S regardless of the thickness of the laser absorbing film Fw.

Although the above exemplary embodiment has been described for the example where the separation facilitating film formed at the interface between the first wafer W and the second wafer S is the metal film Fm (for example, a tungsten film), the kind of the separation facilitating film is not limited thereto.

Specifically, the separation facilitating film is not particularly limited as long as at least its adhesion to the surface film Fe (or the laser absorbing film Fw) is different from the adhesion between the first wafer W and the laser absorbing film Fw, and the position of the separation surface can be selected in the radiation of the laser light to the laser absorbing film Fw.

Furthermore, the position where the separation facilitating film is formed is not limited to the example shown in FIG. 1A and FIG. 1B, that is, between the laser absorbing film Fw and the surface film Fe. By way of example, the separation facilitating film may be formed between the front surface Wa of the first wafer W and the laser absorbing film Fw. In this case, the separation facilitating film needs to be transmissive to the laser light from the laser radiation system 110.

Besides, in the above-described exemplary embodiment, although the non-bonding region Ae is formed at the interface between the first wafer W and the second wafer S after the peripheral modification layer M1 and the split modification layer M2 are formed within the first wafer W, as shown in FIG. 4A to FIG. 4D, the sequence of the wafer processing in the wafer processing system 1 is not limited to thereto. That is, after the non-bonding region Ae is formed at the interface between the first wafer W and the second wafer S as described above, the peripheral modification layer M1 and the split modification layer M2 may be formed within the first wafer W.

Additionally, in the case of removing the peripheral portion We as one body with the rear surface Wb side of the first wafer W shown in FIG. 10A and FIG. 10B, the peripheral modification layer M1 and the internal modification layer M3 may be formed within the first wafer W after the non-bonding region Ae is formed at the interface between the first wafer W and the second wafer S.

It should be noted that the above-described exemplary embodiment is illustrative in all aspects and is not anyway limiting. The above-described exemplary embodiment may be omitted, replaced and modified in various ways without departing from the scope and the spirit of claims.

According to the exemplary embodiments, it is possible to separate the first substrate from the second substrate appropriately in the combined substrate in which the first substrate and the second substrate are bonded to each other.

We claim:

1. A substrate processing method of processing a combined substrate in which a first substrate, an interface layer including a laser absorbing film and a separation facilitating film at least, and a second substrate are stacked on top of each other, the substrate processing method comprising:

acquiring thickness information of the laser absorbing film; and selecting, based on the thickness information, a position of a separation surface between the first substrate and the second substrate from one of a position between the first substrate and the laser absorbing film or a position between the separation facilitating film and the second substrate.

2. The substrate processing method of claim 1, further comprising:

setting an interval of the laser light to be radiated to the laser absorbing film based on the selected position of the separation surface, wherein the laser light is radiated to the laser absorbing film in a pulse shape to achieve the set interval of the laser light.

3. The substrate processing method of claim 2, wherein the interval of the laser light includes an interval in a circumferential direction and an interval in a radial direction, and while rotating the combined substrate and a radiating unit of the laser light relative to each other to achieve the interval in the circumferential direction and, also, while moving the combined substrate and the radiating unit of the laser light relative to each other in a horizontal direction to achieve the interval in the radial direction, the laser light is radiated from the radiating unit to the laser absorbing film.

4. The substrate processing method of claim 2, wherein the interval of the laser light is set based on a thickness of the laser absorbing film such that a laser processing time on the combined substrate is minimized.

5. The substrate processing method of claim 2, wherein the interval of the laser light is set based on a thickness of the laser absorbing film such that a laser processing time on the combined substrate becomes a required laser processing time.

6. The substrate processing method of claim 1, further comprising:

forming a modification layer serving as a starting point of separation of the first substrate by radiating laser light to an inside of the first substrate.

7. The substrate processing method of claim 6, further comprising:

removing a peripheral portion of the first substrate as a removing target, wherein the modification layer formed within the first substrate includes a peripheral modification layer serving as a starting point of separation of the peripheral portion of the first substrate as the removing target.

8. The substrate processing method of claim 1, wherein a second separation facilitating film is formed between the first substrate and the laser absorbing film, and the position of the separation surface between the first substrate and the second substrate is selected from, instead of the position between the first substrate and the laser absorbing film, one of a position between the first substrate and the second separation facilitating film or the position between the separation facilitating film and the second substrate.

* * * * *